(12) United States Patent
Kawamura

(10) Patent No.: US 8,922,152 B2
(45) Date of Patent: Dec. 30, 2014

(54) TEMPERATURE PROTECTION DEVICE

(75) Inventor: Hiromichi Kawamura, Yamato-shi (JP)

(73) Assignee: Nissan Motor Co., Ltd., Yokohama (JP)

( * ) Notice: Subject to any disclaimer, the term of this patent is extended or adjusted under 35 U.S.C. 154(b) by 199 days.

(21) Appl. No.: 13/816,879

(22) PCT Filed: Sep. 12, 2011

(86) PCT No.: PCT/IB2011/002116
§ 371 (c)(1),
(2), (4) Date: Feb. 13, 2013

(87) PCT Pub. No.: WO2012/042324
PCT Pub. Date: Apr. 5, 2012

(65) Prior Publication Data
US 2013/0147407 A1   Jun. 13, 2013

(30) Foreign Application Priority Data

Sep. 28, 2010   (JP) .................................. 2010-217307

(51) Int. Cl.
G05D 23/00 (2006.01)
G01K 3/04 (2006.01)
H03K 17/082 (2006.01)
H03K 17/08 (2006.01)

(52) U.S. Cl.
CPC .............. G01K 3/04 (2013.01); H02P 23/0088 (2013.01); H03K 17/0828 (2013.01); H03K 2017/0806 (2013.01)
USPC .................. 318/641; 318/400.08; 318/400.21; 318/400.22; 318/782; 340/679; 340/584; 340/589; 361/103; 361/115; 180/65.275; 180/65.21; 180/65.265; 327/512; 320/150

(58) Field of Classification Search
USPC .................... 318/641, 400.08, 782, 783, 563, 318/400.21, 400.22, 490; 361/103, 115; 363/37, 98; 340/679; 322/21
See application file for complete search history.

(56) References Cited

U.S. PATENT DOCUMENTS

| 8,203,315 | B2 * | 6/2012 | Ladurner et al. | 320/150 |
| 2003/0076233 | A1 * | 4/2003 | Sato et al. | 340/679 |
| 2004/0124808 | A1 * | 7/2004 | Hirono | 318/806 |
| 2007/0064370 | A1 * | 3/2007 | Kajiwara | 361/103 |
| 2009/0051307 | A1 | 2/2009 | Katsuyama et al. | |

FOREIGN PATENT DOCUMENTS

JP   09-121595 A   5/1997

* cited by examiner

Primary Examiner — Kawing Chan
Assistant Examiner — Jorge L Carrasquillo
(74) Attorney, Agent, or Firm — Global IP Counselors, LLP

(57) ABSTRACT

A temperature protection device basically includes a temperature detector, a temperature estimator, an overheated determining component and an overheating protection component. The temperature detector detects a temperature of a semiconductor component. The temperature estimator estimates an estimated temperature of the semiconductor component. The overheated determining component determines whether the semiconductor component is in an overheated state based on the detected temperature and the estimated temperature by using a first estimated temperature as the estimated temperature at a time point when the detected temperature has reached a first threshold temperature and a second estimated temperature that is estimated subsequent to the time point as the estimated temperature when the detected temperature has reached the first threshold temperature. The overheating protection component protects the semiconductor component from the overheating based on a determination made by the overheated determining component.

13 Claims, 5 Drawing Sheets

TEMPERATURE PROTECTION DEVICE

CROSS-REFERENCE TO RELATED APPLICATIONS

This application is a U.S. National stage of International Application No. PCT/IB2011/002116, filed Sep. 12, 2011. This application claims priority to Japanese Patent Application No. 2010-217307, filed on Sep. 28, 2010. The entire disclosure of Japanese Patent Application No. 2010-217307 is hereby incorporated herein by reference.

BACKGROUND

1. Field of the Invention

The present invention generally relates to a temperature protection device. More particularly, the present invention relates to a temperature protection device that is able to more precisely determine an overheated state of a semiconductor device of, for example, a motor control device, to more reliably protect the semiconductor device from overheating.

2. Background Information

Typically, a power-converter temperature protection device can be provided on the cooling fan for the main circuitry of an inverter. For example, as described in Japanese Unexamined Patent Application No. H-121595, a power-converter temperature protection device can include a temperature sensor that can detect the temperature of a switching element of an inverter primary circuit and output the detected temperature. Also, the power-converter temperature protection device can include a first temperature protection device that decreases the frequency of a carrier signal below a set frequency in response to a protection operate command when the detected temperature is greater than a first heat temperature. The power-converter temperature protection device can further include a second temperature protection device that decreases the torque limit value below a set value in response to a protection operate command is input when the detected temperature is greater than a second heat temperature that is higher than the first heat temperature.

SUMMARY

However, when the temperature sensor is provided near the switching element and a detection signal is sent to a temperature protection device from the temperature sensor, the detection signal from a high-power electric system is sent to the control component of a low-power electric system. Thus, noise is added to the detection signal, which decreases the temperature detection precision of the switching element. As a result, there is the potential for erroneous operations to occur in order to attempt protect the switching element from overheating, when in actuality no overheating is occurring.

Accordingly, an object of the present invention is to provide a temperature protection device for protecting semiconductor elements from overheating while increasing the precision for determining an overheated state in the semiconductor elements.

In view of the state of the known technology, one aspect of the present disclosure is to provide a temperature protection device comprising a temperature detector, a temperature estimator, a overheated state determining component and an overheating protection component. The temperature detector is configured to detect a temperature of a semiconductor component. The temperature estimator is configured to estimate an estimated temperature of the semiconductor component. The overheated state determining component is configured to determine whether the semiconductor component is in an overheated state based on the detected temperature and the estimated temperature by using a first estimated temperature as the estimated temperature at a time point when the detected temperature has reached a first threshold temperature and a second estimated temperature that is estimated subsequent to the time point as the estimated temperature when the detected temperature has reached the first threshold temperature. The overheating protection component configured to protect the semiconductor component from the overheating based on a determination made by the overheated state determining component.

BRIEF DESCRIPTION OF THE DRAWINGS

Referring now to the attached drawings which form a component of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
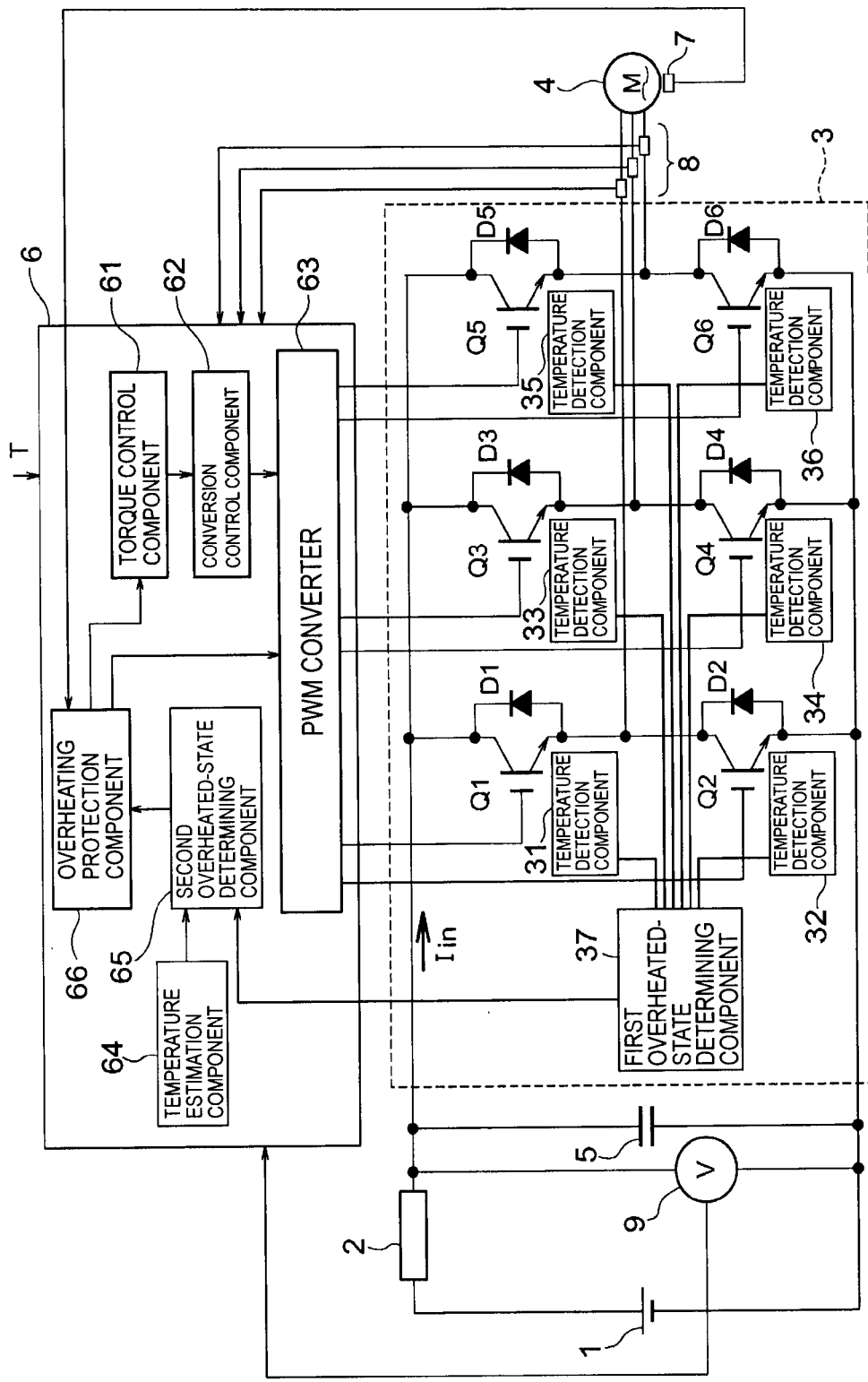
FIG. 1 is a block diagram of a temperature protection device according to a first disclosed embodiment.

Referring initially to FIG. 1, a motor control device for an electric vehicle is illustrated in accordance with a first embodiment. FIG. 1 is a block diagram showing the motor control device that includes a temperature protection device of a first embodiment. The motor control device includes a battery 1 that is electrically connected to the semiconductor module 3. The battery 1 serves as a power source for a permanent magnet motor 4 having a three-phase current output as the travel drive source. The semiconductor module 3 converts the DC power from the battery 1 to AC power. A secondary cell (not shown), such as a lithium ion cell, can be mounted on the battery 1 and supplies DC power to the semiconductor module 3. As discussed below, the motor control device further includes a smoothing capacitor 5, a controller 6, a rotor position sensor 7, a current sensor 8 and a voltage sensor 9.

As understood in the art, in the electric vehicle of this example, the vehicle is driven using the permanent magnet motor 4 having a three-phase current output as the travel drive source, and the motor 4 is linked to the axle of the electric vehicle. The following description uses an electric vehicle as an example, which can be a car, van, truck, SUV, all types of hybrid vehicles (HEVs) and so on.

The semiconductor module 3 in this example is an inverter that includes a plurality of switching elements (insulated gate bipolar transistor IGBT) Q1 to Q6 and rectifying elements (diodes) D1 to D6. The rectifying elements D1 to D6 are connected in parallel to each switching elements Q1 to Q6, respectively, and provide current in the opposite direction from the current directions of the switching elements Q1 to Q6. The DC power of the battery 1 is thereby converted to AC power, and is supplied to the motor 4. In this example, three pairs of circuits having two switching elements connected in parallel are connected in parallel to the battery 1, and electrical connections are respectively made between each pair of switching elements and the three-phase input component of the motor 4. The same semiconductor element can be used for each of the switching elements Q1 to Q6. For example, an insulated gate bipolar transistor (IGBT) can be used as the switching elements Q1 to Q6. However, naturally, the components of the switching elements Q1 to Q6 can be different.

In the example of FIG. 1, the switching elements Q1 and Q2, the switching elements Q3 and Q4, and the switching elements Q5 an Q6 are each connected in series. In this example, the switching elements Q1 and Q2 are coupled to the U phase of the motor 4, the switching elements Q3 and Q4 are connected to the V phase of the motor 4, and the switching elements Q5 and Q6 are connected to the W phase of the motor 4. The switching elements Q1, Q3, and Q5 are electrically connected to the positive electrode side of the battery 1, and the switching elements Q2, Q4, and Q6 are electrically connected to the negative electrode side of the battery 1. ON/OFF switching of the respective switching elements Q1 to Q6 is controlled by the controller 6.

It should be understood that the controller 6 and any other component discussed herein having processing or control capabilities can also each include or share other conventional components such as an input interface circuit, an output interface circuit, and storage devices such as a ROM (Read Only Memory) device and a RAM (Random Access Memory) device. The RAM and ROM store processing results and control programs that are run by the controller 6 and any other such component. Furthermore, the controller 6 and any other such component discussed herein are operatively coupled to the components of the vehicle in a conventional manner. It will be apparent to those skilled in the art from this disclosure that the precise structure and algorithms for the controller 6 and any other processor or controller discussed herein can be any combination of hardware and software that will carry out the functions of the embodiments discussed herein.

The semiconductor module 3 has, in addition to the switching elements Q1 to Q6 and the diodes D1 to D6, temperature detection components 31 to 36, and a first overheated-state determining component 37. The temperature detection components 31 to 36 are provided in the vicinity of, or on, the respective switching elements Q1 to Q6 in the semiconductor module 3. The temperature detection components 31 to 36, for example, can be sensors that are formed from a constant current circuit and a sensing element having a PN junction. The temperature detection components 31 to 36 function as temperature sensors that detect the temperatures of each of the switching elements Q1 to Q6. The temperature detection components 31 to 36 provide current from the constant current circuits to the PN junction portions, and, by reading the change in voltage values at the PN junction components converted in accordance with the switching elements Q1 to Q6, the temperatures of the switching elements Q1 to Q6 can be directly detected. The temperature detection components 31 to 36 are sensors that directly detect the temperatures of each switching element Q1 to Q6. The temperature detection components 31 to 36 thus have a high response rate while being responsive with respect to temperature changes in each of the switching elements Q1 to Q6 in comparison to the temperature estimation component 64 described below. The temperature detection components 31 to 36, upon detecting the temperature of each of the switching elements Q1 to Q6, send the respective detected temperatures for the switching elements Q1 to Q6 to a first overheated-state determining component 37. The temperature detection components 31 to 36 may have configurations other than the configuration described above, provided that they are elements that detect the temperatures of the switching elements Q1 to Q6.

The first overheated-state determining component 37 uses the detected temperatures of the switching elements Q1 to Q6 detected by the temperature detection components 31 to 36 to determine the conditions of the switching elements Q1 to Q6. Details concerning control in the first overheated-state determining component 37 are described below.

The capacitor 5 in this example is a smoothing capacitor. In general, the switching frequencies of the switching elements Q1 to Q6 are approximately five times higher than the phase current that flows between the semiconductor module 3 and motor 4, and are set at about 1 to 100 kHz. The input current $(I_{in})$ that is input to the semiconductor module 3 also includes a ripple having a frequency that is near the switching frequency. In addition, because the impedance 2 on the side of the battery 1 including the power cables and the like is high, there is the danger that a pulsating voltage will be applied to the constituent components of the semiconductor module 3. For this reason, in this example, the capacitor 5 is connected between the impedance 2 and the semiconductor module 3 in order to inhibit voltage pulsation.

The rotor position sensor 7 is a sensor such as a resolver or encoder that is provided on the motor 4. By detecting the position of the rotor of the motor 4, the frequency of the motor 4 is detected, and the detected frequency is output to the controller 6.

The current sensor 8 detects the phase current of each phase of the motor 4, and the detected current is transmitted to the controller 6. A voltage sensor 9 detects the voltage that is supplied from the battery 1 to the semiconductor module 3 and sends the detected voltage to the controller 9.

The controller 6 includes a torque control component 61, a conversion control component 62, a pulse width modulation (PWM) converter 63, a temperature estimation component 64, an overheated-state determining component 65, and an overheating protection component 66. The controller 6 generates switching signals for the switching elements Q1 to Q6 in accordance with a torque command (T) input externally in accordance with the acceleration request from the driver so that the vehicle will be driven in accordance with the intentions of the driver. The switching signals are sent to each of the switching elements Q1 to Q6, thereby controlling the semiconductor module 3.

The torque control component 61 places a limitation on the torque command (T) in accordance with the signals from the overheating protection component 66, thus providing control so that the generated torque of the motor 4 is decreased relative to the requested torque from the driver, and a torque limit command is sent to the conversion control component 62. When it is not necessary to place a limit on the torque in accordance with the signal from the overheating protection component 66, the torque control component 61 outputs the torque command (T) to the conversion control component 62 without placing a limit on the torque command (T).

The conversion control component 62 detects the torque command that is output from the torque control component 61 with the current sensor 8 and detects the phase current of the motor 4 with the voltage sensor 9. Based on the voltage of the battery 1, the optimal command value for minimizing loss at each of the switching elements Q1 to Q6 is computed and output to the PWM converter 63.

The PWM conversion control component 63 sets the carrier frequency of the switching signals of the respective switching elements Q1 to Q6 based on the command value that is output from the conversion control component 62 and generates switching signals having the carrier signal. The switching signals are sent to the gate terminals of each of the switching elements Q1 to Q6. As a result, the PWM conversion control component 63 controls the ON/OFF of each switching terminal, and the semiconductor module 3 converts the DC power supplied from the battery 1 to AC power and supplies it to the motor 4. The PWM conversion control component 63 also controls the carrier frequency of the switching signals based on signals from the overheating protection component 66.

The temperature estimation component 64 estimates the temperatures of the switching elements Q1 to Q6 based on the temperatures detected by the temperature sensors provided on an external component of the semiconductor module 3. The temperature estimation component 64, for example, computes the loss of each of the switching elements Q1 to Q6 from the detection values of the temperature sensors (not shown) provided on the cooler that cools the semiconductor module 3, the detected current of the current sensor 8, and the detected voltage of the voltage sensor 9. The temperature estimation component 64 thus performs an estimation by computing the temperature of each switching element Q1 to Q6 from the losses. In order to determine a model of the element heat dissipation system in advance, the estimated temperature of each switching element Q1 to Q6 is calculated by computation from the detected values of the temperature sensors, the current sensor 8, and the voltage sensor 9. The temperature estimation component 64, in contrast to the temperature detection components 31 to 36, is a component that indirectly calculates the temperatures of the switching elements Q1 to Q6. The temperatures of the switching elements Q1 to Q6 are not directly detected, and, for this reason, the temperature estimation component 64 has a slow response rate with respect to changes in temperature of the switching elements Q1 to Q6. The temperature estimation component 64 may have a configuration other than the configuration described above, provided that it estimates the temperatures of the switching elements Q1 to Q6 by computation.

The second overheated-state determining component 65 determines overheating for the switching elements Q1 to Q6 using signal data that is transmitted from the first over heat condition determination component 37 and the estimated temperatures for the switching elements Q1 to Q6 that are transmitted from the temperature estimation component 64. The second overheated-state determining component 65 then sends the results of the determination of an overheated state to the overheating protection component 66. If the temperatures of the switching elements Q1 to Q6 are high, then this indicates a condition in which there is a heightened potential for malfunction of the switching elements Q1 to Q6, and this indicates a condition in which the switching elements Q1 to Q6 are at or above their rated temperatures.

The overheating protection component 66 transmits, from the overheating protection component 66 to the torque control component 61, a signal indicating that an external limit is to be placed on the input torque based on the results of determination regarding the overheated state. In addition, the overheating protection component 66 transmits a command signal for reducing the carrier frequency of the switching signals of the switching elements Q1 to Q6 to the PWM converter 63 based on the results of determination of an overheated state sent from the overheating protection component 66.

Figure 2:
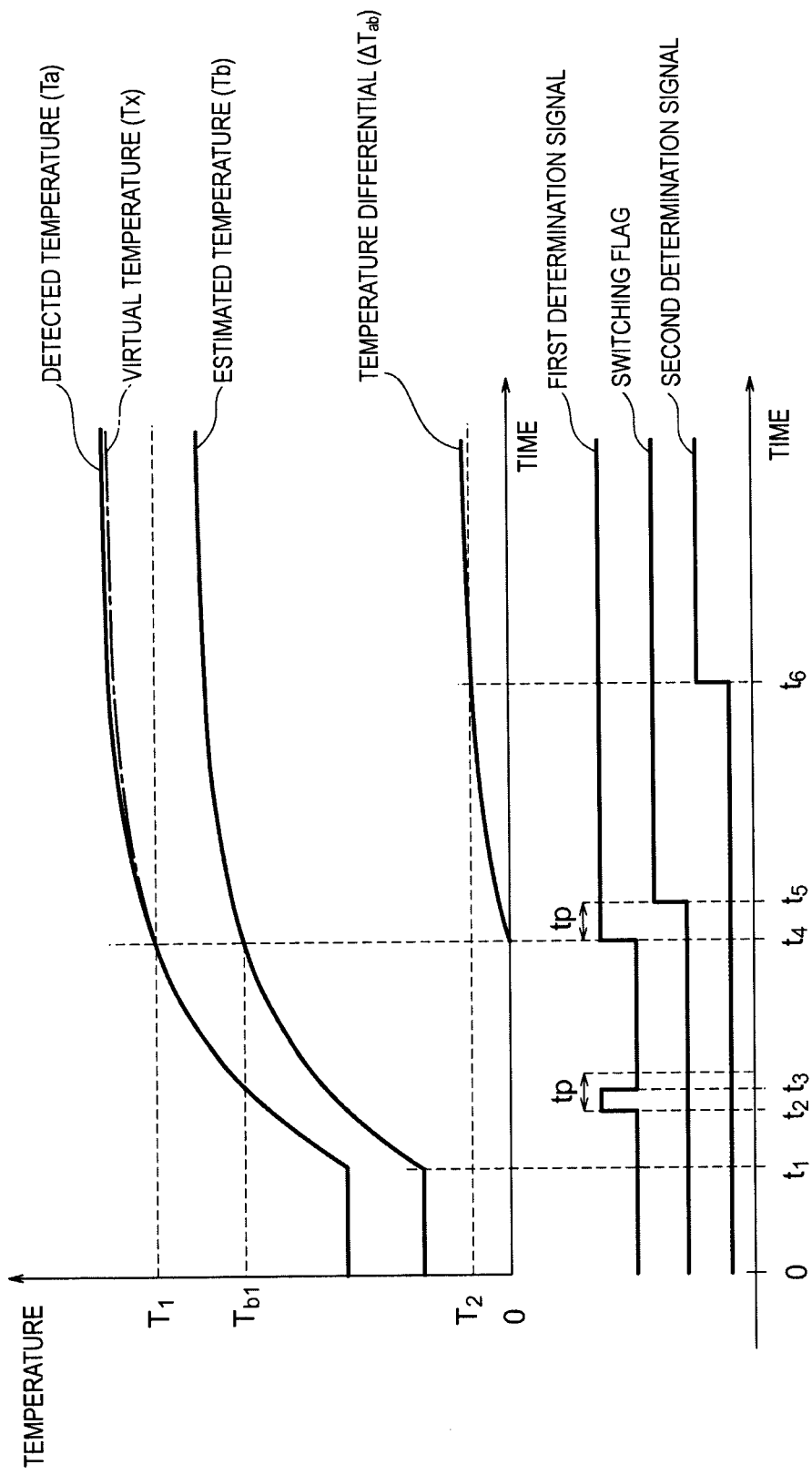
FIG. 2 is a graph showing an example of temperature characteristics of a detected temperature, a virtual temperature, an estimated temperature and a temperature differential, as well as output characteristics a first determination signal, a switching flag and a second determination signal in the temperature protection device of FIG. 1, all in relation to time.

An example of the features and operations of the temperature protection device in this example are described in more detail below in reference to FIGS. 1 and 2. FIG. 2 is a graph showing examples oft the detected temperature ($T_a$) that is detected by the temperature detection components 31 to 36, the estimated temperature ($T_b$) that is estimated by the temperature estimation component 64, the temperature differential ($\Delta T_{ab}$), and the virtual temperature ($T_x$), as well as output characteristic of the first determination signal, the switching flag, and the second determination signal, all in relation to time.

For example, the graph of FIG. 2 shows the change over time when, at time t1, loss is generated at the switching elements Q1 to Q6 and the element temperature rises. Regarding the detected temperature ($T_a$), because the temperature detection components 31 to 36 detect the respective temperatures of the switching elements Q1 to Q6, there are cases where each detected temperature is different. In this case, however, the differences between each detected temperature are small, and the temperatures are thus represented as the detected temperature ($T_a$).

The temperature detection components 31 to 36, as described above, detect the detected temperature ($T_a$) of each switching element Q1 to Q6, which is then transmitted to the first overheated-state determining component 37. The first threshold temperature ($T_1$) is set as the threshold temperature for determining an overheated state in the switching elements Q1 to Q6 in the first overheated-state determining component 37.

An example of the influence of noise on the signals that are transmitted from the temperature detection components 31 to 36 will now be described. As shown in FIG. 1, the temperature detection components 31 to 36 are provided on the high-power electric semiconductor module 3 and transmit signals to the low-power electric system controller 6 via the first overheated-state determining component 37. Consequently, the temperature detection components 31 to 36 transmit high-power electric system signals to the low-power electric system control component, and there is thus a potential for noise addition during transmission. When the temperature of the switching elements Q1 to Q6 is in the low temperature range, the load on the switching elements Q1 to Q6 is small. Therefore, the influence of noise can be inhibited over the time during which overheating of the switching elements Q1 to Q6 is determined. When the temperature of the switching elements Q1 to Q6 is in the high temperature range, a condition results in which there is high load on the switching elements Q1 to Q6. Thus, the temperature of the switching elements Q1 to Q6 increases over the period during which the effects of noise are inhibited by extend the determination time. Consequently, the load on the switching elements Q1 to Q6 is additionally increased, and it is undesirable to extend a determination time in order to eliminate noise.

On the other hand, the temperature estimation component 64 is not provided in a portion of the high-power electric system. Accordingly, by performing processing (e.g., software processing) in the low-power electric system, the temperature of the switching elements Q1 to Q6 is estimated, so that the effects of noise described above are small.

In this example, the first threshold temperature ($T_1$) is used as a boundary, and overheating of the switching elements Q1 to Q6 is determined using the detected temperature ($T_a$) of the temperature detection components 31 to 36 in the temperature range that is below the first threshold temperature. Also, overheating of the switching elements Q1 to Q6 is determined using the estimated temperature ($T_b$) of the temperature estimation component 64 in the high temperature range that is above the first threshold temperature ($T_1$).

The first overheated-state determining component 37 compares the detected temperature ($T_a$) of the temperature detection components 31 to 36 and the first threshold temperature ($T_1$). Next, of the plurality of detected temperatures ($T_a$) of the temperature detection components 31 to 36, when at least one detected temperature ($T_a$) is higher than the first threshold temperature ($T_1$), then the first overheated-state determining component 37 transmits an ON-condition first determination signal to the second overheated-state determining component 65. On the other hand, when the detected temperatures ($T_a$) are at or below the first threshold temperature ($T_1$), then the first overheated-state determining component 37 transmits an OFF-condition first determination signal to the second overheated-state determining component 65. The first determination signal in this example is a two-value signal and is sent by a signal line (not shown) that is insulated from the semiconductor module 3. The first overheated-state determining component 37 places the first determination signal in the OFF condition when at least one of the detected temperatures ($T_a$) changes from a condition in which it is higher than the first threshold temperature ($T_1$) to a condition in which all of the detected temperatures ($T_a$) are at or below the first threshold temperature ($T_1$).

The first threshold temperature ($T_1$) is a predetermined value. For example, the first threshold temperature ($T_1$) may be a temperature determined by subtracting the temperature at which the switching elements Q1 to Q6 rise at a prescribed time at maximum output of the motor 5 from the temperature at which fault occurs in the switching elements Q1 to Q6. The prescribed time referred to above corresponds to the time (tp) discussed below.

Based on first determination signal that transmitted from the first overheated-state determining component 37, the second overheated-state determining component 65 turns the switching flag ON and determines overheating of the switching elements Q1 to Q6 using the estimated temperature (Tb) of the temperature estimation component 64. As described above, it is highly likely that noise will be added to the signal that is transmitted from the semiconductor module 3, and thus the second overheated-state determining component 65 turns the switching flag ON when the first determination signal is in an ON condition for a prescribed time ($t_p$). As a result of addition of noise to the first determination signal, the time at which an ON condition is produced is restricted to a short period of time, and the second overheated-state determining component 65 can be prevented from erroneous detection due to noise by setting the determination time to the prescribed time ($t_p$).

As shown in FIG. 2, from time t2 to time t3, the first determination signal is influenced by noise and assumes an ON condition for a short period of time. However, the ON condition time is shorter than the prescribed time ($t_p$), and thus the second overheated-state determining component 65 does not turn the switching flag on at the time point of time t3. Next, when the detected temperature (Ta) of the switching elements Q1 to Q6 rises, and the detected temperature (Ta) increases above the first threshold temperature ($T_1$), the first overheated-state determining component 37 turns the first determination signal to the ON condition. The second overheated-state determining component 65 turns the switching flag ON at time point (t5) when a determinate time (tp) has passed after time point (t4) at which the first determination signal in the ON condition is received. The second overheated-state determining component 65 stores the estimated temperature ($T_{b1}$) at the time point of time (t4).

The second overheated-state determining component 65, when the switching flag turns ON, computes the temperature differential ($\Delta T_{ab}$) of the estimated temperature ($T_{b1}$) of the temperature estimation component at time point (t4) when the detected temperature (Ta) has exceeded the first threshold temperature ($T_1$) and the estimated temperature (Tb) estimated subsequent to time t4. The temperature differential ($\Delta T_{ab}$) represents the temperature different ($\Delta T_{ab}$) with respect to the estimated temperature ($T_{b1}$) and is a relative temperature with respect to the estimated temperature ($T_{b1}$). The second overheated-state determining component 65, computes the temperature differential ($\Delta T_{ab}$) as necessary when the switching flag turns ON. After the switching flag changes from ON to OFF, the second overheated-state determining component 65 does not refresh the stored estimated temperature ($T_{b1}$) until it turns on again.

The second overheated-state determining component 65 compares the temperature differential ($\Delta T_{ab}$) and the second threshold temperature ($T_2$). At this point, the second threshold temperature ($T_2$) is at a preset temperature, and is set at a temperature that is higher than 0 degrees. When the temperature differential ($\Delta T_{ab}$) is higher than the second threshold temperature ($T_2$), the second overheated-state determining component 65 determines that the switching elements Q1 to Q6 are in an overheated state and turns the second determination signal to the ON condition, and the second determination signal is transmitted to the overheating protection component 66.

At time point (t4) when the detected temperature (Ta) has exceeded the first threshold temperature ($T_1$), the temperature of the switching elements Q1 to Q6 enters into the high-temperature range. In addition, when the detected temperature (Ta) increases, the estimated temperature (Tb) also increases along with the increase in temperature of the switching elements Q1 to Q6. On the other hand, in the high-temperature range, it is desirable to not provide a determination time for noise elimination. In this example, the estimated temperature (Tb) that is rising subsequent to time t4 is thus used in order to virtually estimate the temperatures of the switching elements Q1 to Q6, to thus determine an overheated state. In addition, the second overheated-state determining component 65, using the estimated temperature ($T_{b1}$) at point of time t4 as a standard, determines the overheated state from the rise in temperature of the estimated temperature (Tb) relative to the temperature that serves as a standard. For this reason, the determination precision is increased in this case relative to cases where an overheated state is determined using only the estimated temperature (Tb) over the entire temperature range.

As shown in FIG. 2, the virtual temperature (Tx) is ascertained by the first overheated-state determining component 37 and the second overheated-state determining component 37 and indicates the temperature of the switching elements Q1 to Q6. Prior to time t4, the value changes in the same manner as the detected temperature (Ta), and subsequent to time t4, it changes with the temperature found by adding the temperature differential ($\Delta T_{ab}$) to the first threshold temperature ($T_1$). As a result, the virtual temperature (Tx) can be made to approximate the detected temperature (Ta), and thus the determination precision can be increased in this example.

In addition, when the second overheated-state determining component 65 changes from a condition in which the temperature differential ($\Delta T_{ab}$) is higher than the second threshold temperature ($T_2$) to a temperature that is equal to or lower than the second threshold temperature ($T_2$), the second overheated-state determining component 65 turns the second determination signal to the ON condition. The second overheated-state determining component 65 also transmits a second determination signal to the overheating protection component 66.

As shown in FIG. 2, subsequent to time (t5), the second overheated-state determining component 65 computes the temperature differential ($\Delta T_{ab}$) and compares the temperature differential ($\Delta T_{ab}$) with the second threshold temperature ($T_2$). At the time point of time (t6), the temperature differential ($\Delta T_{ab}$) becomes higher than the second threshold temperature ($T_2$). Thus, the second overheated-state determining component 65 determines that the switching elements Q1 to Q6 are in an overheated state, turns the second determination signal to the OFF condition, and transmits the second determination signal to the overheating protection component 66.

The overheating protection component 66, upon receiving the second determination signal in an ON condition, carries out control operations whereby the switching elements Q1 to Q6 are protected from overheating in accordance with the rotation rate of the motor 4 that has been transmitted from the rotor position sensor 7. The threshold rotation rate for switching control for overheating protection is set in the overheating protection component 66. When the rotation rate that has been detected by the rotor position sensor 7 is greater than this threshold rotation rate, the overheating protection component 66 transmits a control signal to the torque control component 61. Thus, a limitation is placed on the torque command (T), and the load on the switching elements Q1 to Q6 is decreased. On the other hand, when the rotation rate detected by the rotor position sensor 7 is less than the threshold rotation rate, the overheating protection component 66 transmits a control signal to the PWM 63. Thus, a limit is placed on the carrier frequency of the switching signal, and the load on the switching elements Q1 to Q6 is decreased.

Figure 3:
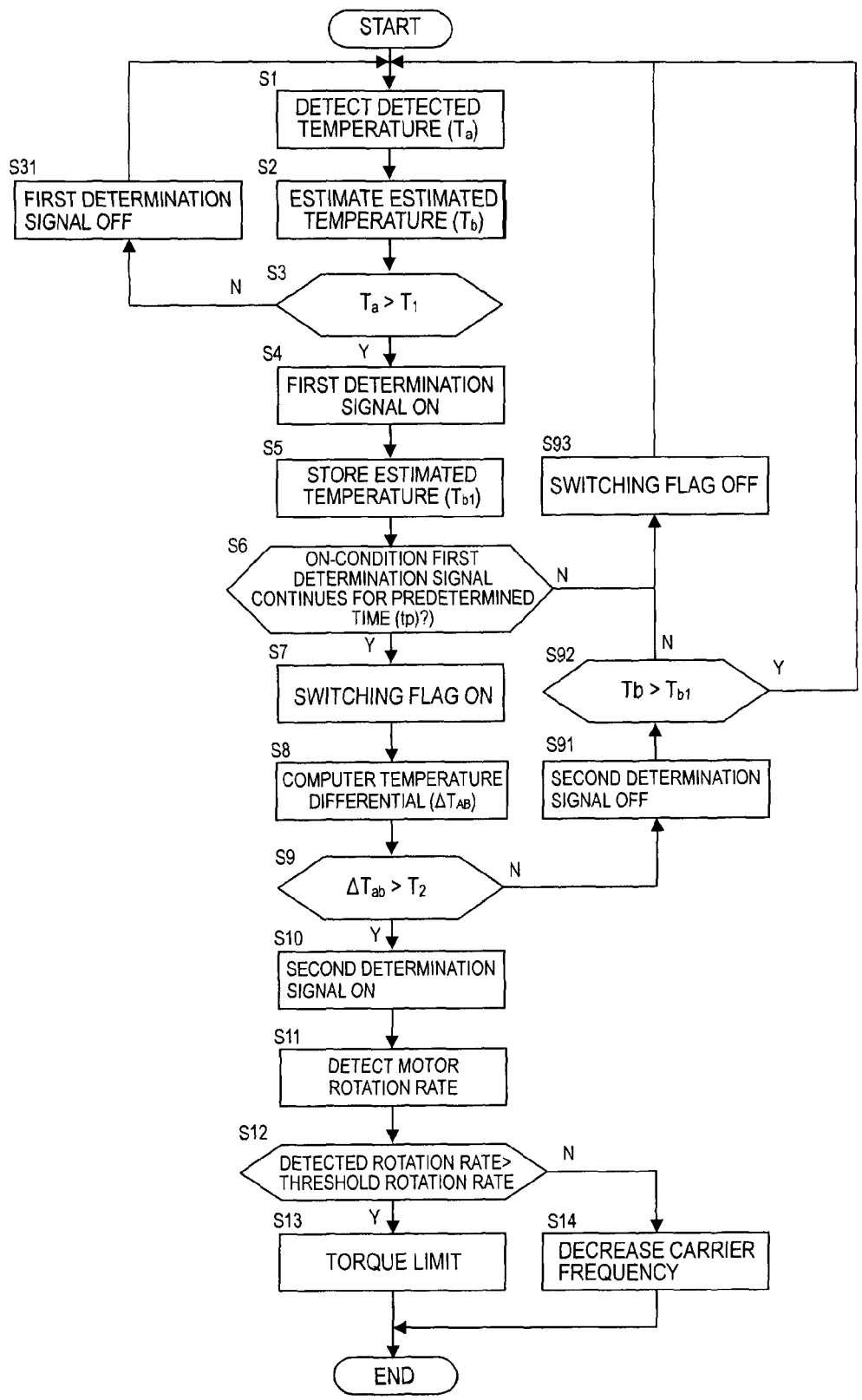
FIG. 3 is a flow chart showing examples of operations performed by the temperature protection device shown in FIG. 1.

The control sequence of the temperature protection device in this example is described next in reference to FIG. 3. FIG. 3 is a flow chart showing an example of operations performed by the temperature protection device in this example.

In step S1, the temperature detection components 31 to 36, which can also be referred to as temperature detection means, detect the temperature of the switching elements Q1 to Q6 during a prescribed sampling period, and the detected temperature (Ta) is transmitted to the first overheated-state determining component 37. In step S2, the temperature estimation component 64 estimates the temperature of the switching elements Q1 to Q6 in the prescribed sampling period and transmits the estimated temperature (Tb) to the second overheated-state determining component 65. In step S3, the first overheated-state determining component 37 compares the detected temperature (Ta) with the first threshold temperature ($T_1$).

If the detected temperature (Ta) is higher than the first threshold temperature ($T_1$), then, in step S4, the first overheated-state determining component 37 transmits a first detection signal in an ON condition to the second overheated-state determining component 65. On the other hand, if the detected temperature (Ta) is at or below the first threshold temperature ($T_1$), then the first overheated-state determining component 37 transmits the first detection signal in an OFF condition to the second overheated-state determining component 65 in step S31, and the processing returns to step S1.

In step S5, the second overheated-state determining component 65 stores the estimated temperature ($T_{b1}$) at the time point at which the detected temperature (Ta) has reached the first threshold temperature based on the first determination signal in step S4. In step S6, the second overheated-state determining component 65 determines whether or not the ON condition of the first determination signal has continued for the prescribed time (tp) from the receipt condition of the first detection signal in step S4. If the elapsed time that the first determination signal is in the ON condition is greater than a predetermined time (tp), then, in step S7, the second overheated-state determining component 65 turns the switching flag ON. On the other hand, if the elapsed time that the first determination signal is in the ON condition is at or below the predetermined time (tp), then, in step S93, the second overheated-state determining component 65 turns the switching flag OFF, and the routine returns to step S1.

In step S8, the second overheated-state determining component 65 computes the temperature differential ($\Delta T_{ab}$) from the estimated temperature (Tb) and the estimated temperature ($T_{b1}$) in step S5. In step S9, the second overheated-state determining component 65 compares the temperature differential ($\Delta T_{ab}$) and the second threshold value temperature ($T_2$). If the temperature differential ($\Delta T_{ab}$) is higher than the second threshold temperature ($T_2$), then the second overheated-state determining component 65 turns the second determination signal ON and transmits it to the overheating protection component 66 in step S10.

On the other hand, if the temperature differential ($\Delta T_{ab}$) is at or below the second threshold temperature ($T_2$), then, in step S91, the second overheated-state determining component 65 turns the second determination signal OFF and transmits the second determination signal to the overheating protection component 66. Next, in step S92, the second overheated-state determining component 65 compares the estimated temperature (Tb) and the estimated temperature ($T_{b1}$). If the estimated temperature (Tb) is higher than the estimated temperature ($T_{b1}$), then the second overheated-state determining component 65 determines that the temperature of the switching elements Q1 to Q6 is rising, and the routine return to step S1. On the other hand, if the estimated temperature (Tb) is a temperature that is at or below the estimated temperature ($T_{b1}$), then the temperature of the switching elements Q1 to Q6 has decreased past the first threshold temperature ($T_1$). In this event, the second overheated-state determining component 65 determines that the detected temperature (Ta) of the switching elements Q1 to Q6 has returned to the low-temperature range. Therefore, the switching flag is turned off in step S93, and the routine returns to step S1.

However, if the processing has continued to step S10 as discussed above, then in step S11, the overheating protection component 66 detects the rotation rate of the motor 4 using the rotor position sensor 7 based on the second determination signal set in step S10. In step S12, the overheating protection component 66 compares the detected rotation rate with the threshold rotation rate. If the rotation rate is higher than the threshold rotation rate, then the overheating protection component 66 transmits a control signal to the torque control component 61, and the torque control component 61 places a limitation on the torque that has been input in step S13. On the other hand, if the rotation rate is at or below the threshold rotation rate, then the overheating protection component 66 transmits a control signal to the PWM converter 63, and the PWM converter 63 decreases the carrier frequency in step S14. As a result, in this example, it is determined that the switching elements Q1 to Q6 are in an overheated state. Based on this determination, the switching elements Q1 to Q6 are protected from overheating.

As described above, in this example, temperature detection components 31 to 36 and a temperature estimation component 64 are provided. Thus, overheating of the switching elements Q1 to Q6 is determined by the first overheated-state determining component 37 and the second overheated-state determining component 65 using the estimated temperature ($T_{b1}$) at the time point when the detected temperature ($T_a$) has reached the first threshold temperature ($T_1$) and the estimated temperature ($T_b$) estimated subsequent to the time point at which the detected temperature ($T_a$) has reached the first threshold temperature ($T_1$). The switching elements Q1 to Q6 are thus protected from overheating. As a result, because overheating of the switching elements Q1 to Q6 is determined based on the detected temperature ($T_a$) in a low-temperature range that is below the first threshold temperature ($T_1$), it is possible to suppress disparity between the actual temperature of the switching elements Q1 to Q6 and the detected temperature used for determination, thereby increasing the determination precision. In addition, because the estimated temperature ($T_{b1}$) and the estimated temperature ($T_b$) are used in a high-temperature range that is higher than the first threshold temperature ($T_1$), addition of noise to the signal is suppressed when the temperature that is used for determination is transmitted and received by a signal, and erroneous determination in the high-temperature range can be avoided. As a result, it is possible to suitably protect the switching elements Q1 to Q6 from overheating.

In addition, when the temperature differential ($\Delta T_{ab}$) between the estimated temperature ($T_{b1}$) and the estimated temperature ($T_b$) is calculated, if the temperature differential ($\Delta T_{ab}$) is greater than the second threshold temperature ($T_2$), then it is determined that the switching elements Q1 to Q6 are in an overheated state. As a result, in the high-temperature range, a determination is made using a relative temperature with the estimated temperature ($T_{b1}$) as a standard. Accordingly, determinations can be made from temperature data that tracks the actual temperatures of the switching elements Q1 to Q6, and it is thus possible to increase determination precision in regard to an overheated state in the high-temperature range as well. As a result, the switching elements Q1 to Q6 can be appropriately protected from overheating. In addition, it is possible to avoid erroneous determinations regarding an overheated state in the high-temperature range, and overheating protection for the switching elements Q1 to Q6 can be provided with favorable precision.

In addition, the torque of the motor 4 is limited, thereby protecting the switching elements Q1 to Q6 from overheating. As a result, an absence of noise or very minimal noise can be maintained in the inverter while allowing the switching elements Q1 to Q6 to be suitably protected from overheating. In this example, either control of the torque of the motor 4 or control of the carrier frequency is selected based on the rotation rate, and the switching elements Q1 to Q6 are protected from overheating. When the second determination signal is received in an ON condition, control involving limiting the torque of the motor 4, control involving decreasing the carrier frequency, or control involving limiting the torque of the motor 4 and involving decreasing the carrier frequency may be performed.

Moreover, when the rotation rate of the motor 4 is smaller than the threshold rotation rate, the carrier frequency of the switching signal is decreased, thereby protecting the switching elements Q1 to Q6 from overheating. As a result, deterioration in the power performance of the motor 4 can be prevented over a long period of time, and the switching elements Q1 to Q6 can be suitably protected from overheating.

In addition, when the rotation rate of the motor 4 is higher than the threshold rotation rate, the torque of the motor 4 is limited, and when the rotation rate of the motor 4 is lower than the threshold rotation rate, then the carrier frequency of the switching signal is decreased, thereby protecting the switching elements Q1 to Q6 from overheating. As a result, the power performance of the motor 4 can be maintained over a broad range of operating points, and the switching elements Q1 to Q6 can be suitably protected from overheating.

Also in this example, the second overheated-state determining component 65 turns the switching flag ON when the detected temperature ($T_a$) is higher than the first threshold temperature ($T_1$) and when the ON condition of the first determination signal has continued for at least time (tp). Determination of an overheated state of switching elements Q1 to Q6 is performed using the estimated temperature ($T_{b1}$) and the estimated temperature ($T_b$). As a result, erroneous determinations due to noise added to the signal that transmits and receives the detected temperature ($T_a$) can be avoided. Also, the first threshold temperature ($T_1$) is set at the temperature that is found by subtracting the rising temperature of the switching elements Q1 to Q6 over time (tp) when the output of the motor 4 is at maximum from the temperature at which fault occurs in the switching elements Q1 to Q6. As a result, a determination is made in the high temperature range in this example prior to when the switching elements Q1 to Q6 reach abnormal temperatures, which increases the determination precision while allowing protection of the switching elements Q1 to Q6.

Furthermore, overheating of the switching elements Q1 to Q6 is determined using the temperature differential ($\Delta T_{ab}$) and the second threshold temperature ($T_2$), but the second threshold temperature ($T_2$) is set in accordance with the estimated temperature ($Tb_1$). When the estimated temperature ($T_b$) that is estimated after the time at which the detected temperature ($T_a$) reaches the first threshold temperature ($T_1$) exceeds the second threshold temperature ($T_2$), it may be determined that the switching elements Q1 to Q6 are in an overheated state. Referring to FIG. 2, a determination can also be made as to whether or not the temperature rise of the estimated temperature ($T_b$) that is estimated subsequent to time (t4) has exceeded the second threshold temperature ($T_2$) that is set higher than the estimated temperature ($T_{b1}$). At this time, the second threshold temperature ($T_2$) may be set higher than at least the estimated temperature ($T_{b1}$). Thus, the second threshold temperature ($T_2$) in this example is set in accordance with the estimated temperature ($T_{b1}$) at the time point when the detected temperature ($T_a$) has reached the first threshold temperature ($T_1$). As a result, a determination can be made based on temperature data that tracks actual temperatures of the switching elements Q1 to Q6, allowing an increase in determination precision concerning an overheated state in high-temperature ranges as well. Accordingly, switching elements Q1 to Q6 can be suitably protected from overheating. In addition, it is possible to avoid erroneous determination of an overheated state under high-temperature conditions, while also protecting the switching elements Q1 to Q6 from overheating with high precision.

The second threshold temperature ($T_2$) can be set in accordance with the magnitude of the estimated temperature ($T_{b1}$). The rate of increase of the estimated temperature ($T_b$) may be different depending on the magnitude of the temperature that is used as a standard. In this example, the temperature at the start of the increase of the estimated temperature ($T_b$) is not fixed, and thus the magnitude of the estimated temperature ($T_{b1}$) will differ depending on the situation. For this reason, in high-temperature ranges, the temperature that serves as a standard when determining an overheated state for the switching elements Q1 to Q6 is not necessarily fixed. Therefore, it is possible to increase the determination precision regarding an overheated state by setting the second threshold temperature ($T_2$) in accordance with the estimated temperature ($T_{b1}$).

Furthermore, in this example, the first overheated-state determining component was set in the semiconductor module 3. However, the component may be placed outside the semiconductor module 3 in the controller 9.

In addition, the temperature detection components 31 to 36 in this example can be considered to correspond to "temperature detection means," and the temperature estimation component 64 can be considered to correspond to "temperature estimation means." Also, the switching elements Q1 to Q6 can be considered to correspond to "semiconductor elements," the overheating protection component 66 can be considered to correspond to "overheating protection means," and the first overheated-state determining component 37 and the second overheated-state determining component 65 can be considered to correspond to "overheated-state determining means." Furthermore, the inverter formed by the switching elements Q1 to Q6 and the rectifying elements D1 to D6 can be considered to correspond to an "inverter.".

The temperature protection device pertaining to a second disclosed embodiment will now be described below with reference to FIGS. 1, 4 and 5. This example is different from the first embodiment described above in that the second overheated-state determining component 65 sets a third threshold temperature ($T_3$), and the overheated state of the switching elements Q1 to Q6 is determined in two stages. The remainder of the configuration is similar to that of the first embodiment.

Figure 4:
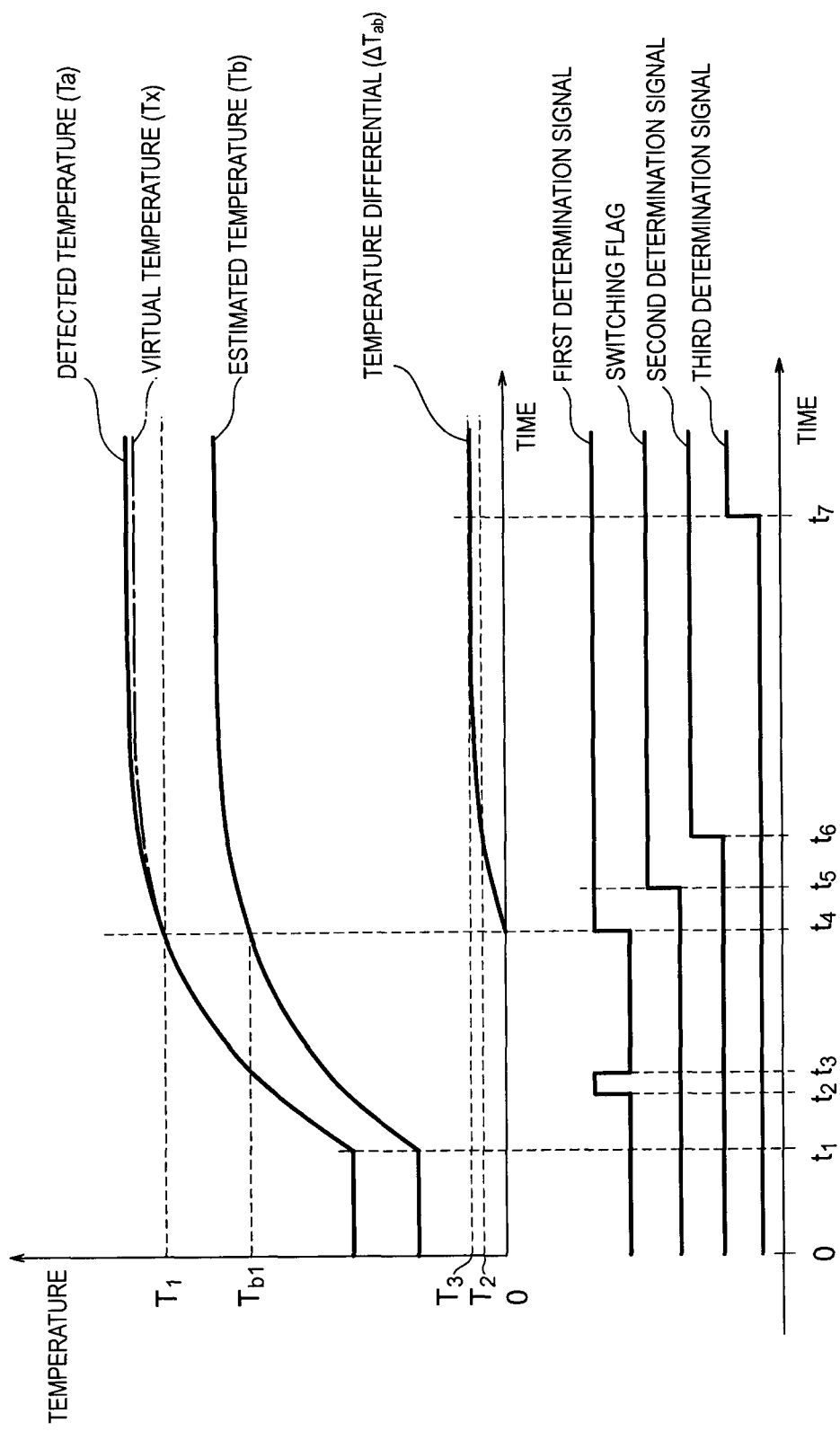
FIG. 4 is a graph showing an example of temperature characteristics of a detected temperature, a virtual temperature, an estimated temperature and a temperature differential, as well as output characteristics a first determination signal, a switching flag, a second determination signal and a third determination signal in a temperature protection device according to a second disclosed embodiment, all in relation to time.
Figure 5:
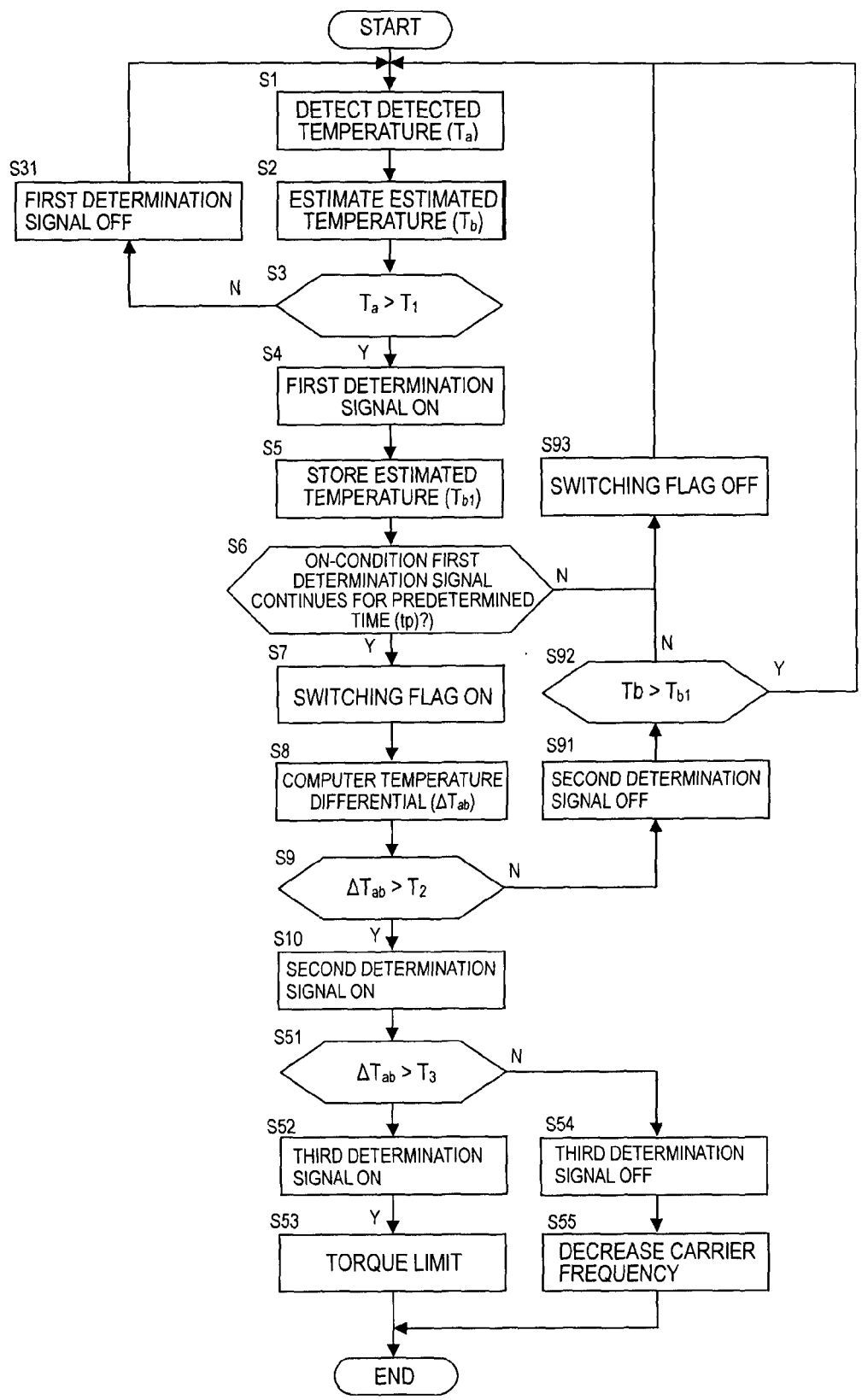
FIG. 5 is a flow chart showing an example of operations performed by a temperature protection device according to the second disclosed embodiment.

FIG. 4 is a graph showing example of the detected temperature ($T_a$) detected by the temperature detection components 31 to 36, the estimated temperature ($T_b$) estimated by the temperature estimation component 64, the temperature differential ($\Delta T_{ab}$), and the virtual temperature ($T_x$), as well as the first determination signal, the switching flag, the second determination signal, and the third determination signal in relation to time. FIG. 5 is a flow chart illustrating an example of operations performed by the temperature protection device of this example.

The second threshold temperature ($T_2$) and third threshold temperature ($T_3$) are set in the second overheated-state determining component 65. The third threshold temperature ($T_3$) is a predetermined temperature that is higher than the second threshold temperature ($T_2$) and is set at a temperature that is higher than 0 degrees. The second threshold temperature ($T_2$) and the third threshold temperature ($T_3$) are temperatures that are set in order to switch control in accordance with the overheated state of the switching elements Q1 to Q6 so that the switching elements Q1 to Q6 are protected from overheating.

When the temperature differential ($\Delta T_{ab}$) is higher than the second threshold temperature ($T_2$), the second overheated-state determining component 65 turns the second determination signal ON, and the second determination signal is sent to the overheating protection component 66. If the temperature differential ($\Delta T_{ab}$) is higher than the third threshold temperature ($T_3$), then the second overheated-state determining component 65 turns the third determination signal ON and transmits the third determination signal to the overheating protection component 66. When the overheating protection component 66 has received the second determination signal in an ON condition, the PWM converter 63 is controlled, and the carrier frequency of the switching signals of the switching elements Q1 to Q6 are decreased. When the overheating protection component 66 has received the third determination signal in the ON condition, the torque control component 61 is controlled, and a limit is placed on the torque of the motor 4.

Control in this example is described below with reference to FIG. 4 with regard to the generation of loss in the switching elements Q1 to Q6 at time t1 and change over time when the element temperatures increase. Control occurring from time (0) to time (t5) is the same or similar to that in the first embodiment discussed above and is thus not repeated.

Accordingly, at time (t6), when the temperature differential ($\Delta T_{ab}$) increases past the second threshold temperature ($T_2$), the second overheated-state determining component 65 determines that the switching elements Q1 to Q6 are in an overheated state. Therefore, the second overheated-state determining component 65 turns the second determination signal ON, then sends the signal to the overheating protection component 66. The overheating protection component 66 sends a control signal to the PWM converter 63 and controls the PWM converter 63. The PWM converter 63 decreases the carrier frequency of the switching signal.

When the temperature of the switching elements Q1 to Q6 increases and the temperature differential ($\Delta$Tab) increases past the third threshold temperature ($T_3$) at time (t7), the second overheated-state determining component 65 determines that the switching elements Q1 to Q6 are in an overheated state. Accordingly, the second overheated-state determining component 65 turns the third determination signal ON, then sends the signal to the overheating protection component 66. The overheating protection component 66 transmits a control signal to the torque control component 61 and controls the torque control component 61. The torque control component 61 places a limit on the torque of the motor 4.

As a result, when the temperature differential ($\Delta T_{ab}$) is higher than the second threshold temperature ($T_2$) but lower than the third threshold temperature ($T_3$), the overheating protection component 66 controls the PWM converter 63 and decreases the carrier frequency of the switching signals, thereby protecting the switching elements Q1 to Q6 from overheating. In addition, when the temperature differential ($\Delta T_{ab}$) is higher than the third threshold temperature ($T_3$), the overheating protection component 66 controls the torque control component 61 and applies a limit to the torque of the motor 4, thereby protecting the switching elements Q1 to Q6 from overheating.

Next, an example of operations performed by the temperature protection device according to the second embodiment will now be described with reference to FIG. 5. The operations pertaining to steps S1 to step S10 are the same as in the first embodiment discussed above and thus their descriptions are not repeated.

After step S10 has been reached as discussed above, the second overheated-state determining component 65 compares the temperature differential ($\Delta T_{ab}$) and the third threshold temperature ($T_3$) in step S51. If the temperature differential ($\Delta T_{ab}$) is higher than the third threshold temperature ($T_2$), then the third overheated-state determining component 65 turns the third determination signal ON and sends the third determination signal to the overheating protection component 66 in step S52. Next, the overheating protection component 66 controls the torque control component 61 and applies a limit to the torque in step S53.

On the other hand, when the temperature differential ($\Delta$Tab) is at a temperature that is at or below the third threshold temperature ($T_3$), then in step S54, the second overheated-state determining component 65 turns the third determination signal OFF and sends it to the overheating protection component 66. The overheating protection component 66 then controls the PWM 63 and decreases the carrier frequency of the switching signal.

In the example described above, when the temperature differential ($\Delta T_{ab}$) is higher than the second threshold temperature ($T_2$) and lower than the third threshold temperature ($T_3$), then the carrier frequency of the switching frequency of the switching elements Q1 to Q6 is decreased. Also, when the temperature differential ($\Delta T_{ab}$) is higher than the third threshold temperature ($T_3$), the torque of the motor 4 is limited. As a result, in this example, by placing a limit on the torque, control involving decreasing the carrier frequency is preferentially utilized, thereby preventing loss in power performance of the motor 4. Moreover, even if the carrier frequency is decreased, in a situation where the temperature of the switching elements Q1 to Q6 continues to increase due to change in the rotation rate of the motor 4 or the torque command value, abnormalities in the switching elements Q1 to Q6 can be avoided because the torque is limited. As a result, the switching elements Q1 to Q6 can be protected while increasing determination precision regarding the overheated state.

In this example, the temperature differential ($\Delta T_{ab}$), the second threshold temperature ($T_2$) and the third threshold temperature ($T_3$) are used in order to determine an overheated state in the switching elements Q1 to Q6. However, the second threshold temperature ($T_2$) and the third threshold temperature ($T_3$) can be set in accordance with an estimated temperature ($T_{b1}$). Therefore, when the estimated temperature ($T_b$) that is estimated subsequent to the time at which the detected temperature ($T_a$) reaches the first threshold temperature ($T_1$) exceeds the second threshold temperature ($T_2$), the second overheated-state determining component 65 turns the second determination signal ON. Also, when the estimated temperature ($T_b$) exceeds the third threshold temperature ($T_3$), the second overheated-state determining component 65 turns the third determination signal ON. As a result, in this example, it is not necessary to compute the temperature differential ($\Delta T_{ab}$). By using the estimated temperature ($T_b$) that is estimated after the time at which the detected temperature ($T_a$) has reached the first threshold temperature ($T_1$), if the estimated temperature ($T_b$) is lower than the third threshold temperature ($T_3$) and higher than the second threshold temperature ($T_2$), then the carrier frequency of the switching signals of the switching elements Q1 to Q6 is decreased. However, if the second estimated temperature ($T_b$) is higher than the third threshold temperature ($T_3$), control is carried out so that the torque of the motor 4 is limited.

Moreover, the second threshold temperature ($T_2$) and the third threshold temperature ($T_3$) can be set in accordance with the magnitude of the estimated temperature ($T_{b1}$), and the rate of increase of the estimated temperature ($T_b$) may be different depending on the magnitude of the temperature that is used as a standard. In this example, the temperature at initiation of the increase in the estimated temperature ($T_b$) is not fixed, and thus the magnitude of the estimated temperature ($T_{b1}$) differ depending on the situation. For this reason, in high-temperature ranges, the temperature that serves as a standard when determining an overheated state for the switching elements Q1 to Q6 is not necessarily fixed, and thus it is possible to increase the determination precision regarding an overheated state by setting the third threshold temperature ($T_3$) in accordance with the estimated temperature ($T_{b1}$).

As can be appreciated from the above, precision in the determination of an overheated state is maintained by using the detected temperature of a semiconductor element in the disclosed embodiments. Also, noise effects are reduced by using an estimated temperature in high temperature ranges. Consequently, mistaken determination of an overheated state is avoided, and semiconductor elements can be more reliably protected from overheating.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. The terms "detect" or "sense" and their variations as used herein to describe an operation or function carried out by a component, a section, a device or the like includes a component, a section, a device or the like that does not require physical detection or sensing, but rather includes determining, measuring, modeling, predicting or computing or the like to carry out the operation or function. The term "configured" as used herein to describe a component, section or part of a device includes hardware and/or software that is constructed and/or programmed to carry out the desired function. The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A temperature protection device comprising:
a temperature detector configured to detect a temperature of a semiconductor component;
a temperature estimator configured to estimate an estimated temperature of the semiconductor component;
an overheated determining component configured to determine whether the semiconductor component is in an overheated state based on the detected temperature and the estimated temperature by using a first estimated temperature at a time point when the detected temperature has reached a first threshold temperature and a second estimated temperature that is estimated subsequent to the time point at which the detected temperature has reached the first threshold temperature, the overheated determining component being further configured to calculate a temperature differential between the first estimated temperature and the second estimated temperature, and determine that the semiconductor component is in an overheated state when the temperature differential has exceeded a second threshold temperature; and an overheating protection component configured to protect the semiconductor component from the overheating based on a determination made by the overheated determining component.

2. The temperature protection device according to claim 1, wherein the overheated determining component is further configured to set the second threshold temperature to a higher value than the first estimated temperature; and determine that the semiconductor component is in an overheated state upon determining the second estimated temperature has exceeded the second threshold temperature.

3. A motor control device including the temperature protection device according to claim 2, and further comprising an inverter including the semiconductor component; and a motor configured to be driven by power supplied from the inverter;

the overheating protection component being further configured to limit a torque of the motor to protect the semiconductor component from the overheated state.

4. A motor control device including the temperature protection device according to claim 2, and further comprising an inverter including the semiconductor component;

a motor configured to be driven by power supplied from the inverter; and a rotation rate detector configured to detect a rotation rate of the motor;

the overheating protection component being further configured to reduce a carrier frequency of a switching signal of the semiconductor component upon determining that the rotation rate that is detected by the rotation rate detector is smaller than a predetermined rotation rate to protect the semiconductor component from the overheated state.

5. A motor control device including the temperature protection device according to claim 2, and further comprising an inverter including the semiconductor component;

a motor configured to be driven by power supplied from the inverter; and a rotation rate detector configured to detect a rotation rate of the motor;

the overheating protection component being further configured to limit a torque of the motor upon determining that the rotation rate that is detected by the rotation rate detector is greater than a predetermined rotation rate to protect the semiconductor component from the overheated state; and reduce a carrier frequency of a switching signal of the semiconductor component upon determining that the rotation rate that is detected by the rotation rate detector is smaller than a predetermined rotation rate to protect the semiconductor component against the overheated state.

6. A motor control device including the temperature protection device according to claim 2, and further comprising an inverter including the semiconductor component; and a motor configured to be driven by power that is supplied from the inverter;

the overheated determining component being configured to determine that the semiconductor component is in the overheated state by using the first estimated temperature and the second estimated temperature upon determining a state in which the detected temperature is higher than the first threshold temperature has continued for a predetermined time; and the first threshold temperature is set at a temperature obtained by subtracting a temperature of the semiconductor component after the predetermined time has elapsed at maximum output of the motor from a temperature at which a fault occurs in the semiconductor component.

7. A motor control device including the temperature protection device according to claim 2, and further comprising an inverter including the semiconductor component;

a motor configured to be driven by power that is supplied from the inverter; and a rotation rate detector configured to detect the rotation rate of the motor;

the overheating protection component being further configured to reduce a carrier frequency of a switching signal of the semiconductor device upon determining that the second estimated temperature is lower than a third threshold temperature which is a temperature that is higher than the second threshold temperature, and the second estimated temperature is higher than the second threshold temperature; and limit a torque of the motor when the second estimated temperature is a temperature that is higher than the third threshold temperature.

8. A motor control device including the temperature protection device according to claim 1, and further comprising an inverter including the semiconductor component; and a motor configured to be driven by power supplied from the inverter;

the overheating protection component being further configured to limit a torque of the motor to protect the semiconductor component from the overheated state.

9. A motor control device including the temperature protection device according to claim 1, and further comprising an inverter including the semiconductor component;

a motor configured to be driven by power supplied from the inverter; and a rotation rate detector configured to detect a rotation rate of the motor;

the overheating protection component being further configured to reduce a carrier frequency of a switching signal of the semiconductor component upon determining that the rotation rate that is detected by the rotation rate detector is smaller than a predetermined rotation rate to protect the semiconductor component from the overheated state.

10. A motor control device including the temperature protection device according to claim 1, and further comprising an inverter including the semiconductor component;

a motor configured to be driven by power supplied from the inverter; and a rotation rate detector configured to detect a rotation rate of the motor;

the overheating protection component being further configured to limit a torque of the motor upon determining that the rotation rate that is detected by the rotation rate detector is greater than a predetermined rotation rate to protect the semiconductor component from the overheated state; and reduce a carrier frequency of a switching signal of the semiconductor component upon determining that the rotation rate that is detected by the rotation rate detector is smaller than a predetermined rotation rate to protect the semiconductor component against the overheated state.

11. A motor control device including the temperature protection device according to claim 1, and further comprising an inverter including the semiconductor component; and a motor configured to be driven by power that is supplied from the inverter;

the overheated determining component being configured to determine that the semiconductor component is in the overheated state by using the first estimated temperature and the second estimated temperature upon determining a state in which the detected temperature is higher than the first threshold temperature has continued for a predetermined time; and the first threshold temperature is set at a temperature obtained by subtracting a temperature of the semiconductor component after the predetermined time has elapsed at maximum output of the motor from a temperature at which a fault occurs in the semiconductor component.

12. A motor control device including the temperature protection device according to claim 1, and further comprising an inverter including the semiconductor component;

a motor configured to be driven by power that is supplied from the inverter; and a rotation rate detector configured to detect the rotation rate of the motor;

the overheating protection component being further configured to reduce a carrier frequency of a switching signal of the semiconductor device upon determining that the second estimated temperature is lower than a third threshold temperature which is a temperature that is higher than the second threshold temperature, and the second estimated temperature is higher than the second threshold temperature; and limit a torque of the motor when the second estimated temperature is a temperature that is higher than the third threshold temperature.

13. A temperature control method comprising:

detecting a temperature of a semiconductor component as a detected temperature;

estimating a temperature of the semiconductor component as an estimated detected temperature;

estimating a first estimated temperature at a time point when the detected temperature has reached a first threshold temperature;

estimating a second estimated temperature that is estimated subsequent to the time point at which the detected temperature has reached the first threshold temperature;

calculating a temperature differential between the first estimated temperature and the second estimated temperature;

determining that the semiconductor component is in an overheated state when the temperature differential has exceeded a second threshold temperature; and protecting the semiconductor component from the overheated state based on a result of a determination that was made in the determining using the detected temperature and the first and second estimated temperatures.

* * * * *